United States Patent
Kodama et al.

(10) Patent No.: US 9,824,900 B2
(45) Date of Patent: Nov. 21, 2017

(54) BONDED STRUCTURE AND PRODUCTION METHOD THEREFOR

(71) Applicant: Hitachi, Ltd., Chiyoda-ku, Tokyo (JP)

(72) Inventors: Motomune Kodama, Tokyo (JP); Takashi Naito, Tokyo (JP); Yuichi Sawai, Tokyo (JP); Tadashi Fujieda, Tokyo (JP); Takuya Aoyagi, Tokyo (JP); Masanori Miyagi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/440,124

(22) PCT Filed: Nov. 9, 2012

(86) PCT No.: PCT/JP2012/079060
§ 371 (c)(1),
(2) Date: May 1, 2015

(87) PCT Pub. No.: WO2014/073086
PCT Pub. Date: May 15, 2014

(65) Prior Publication Data
US 2015/0279700 A1    Oct. 1, 2015

(51) Int. Cl.
*C03C 3/21* (2006.01)
*C03C 3/12* (2006.01)
(Continued)

(52) U.S. Cl.
CPC .......... *H01L 21/481* (2013.01); *B32B 7/02* (2013.01); *B32B 7/04* (2013.01); *B32B 27/06* (2013.01);
(Continued)

(58) Field of Classification Search
CPC   H01L 21/481; B32B 7/02; B32B 7/04; B32B 27/06; B32B 2264/102;
(Continued)

(56) References Cited

U.S. PATENT DOCUMENTS

| 5,013,697 A | 5/1991 | Akhtar |
| 2006/0009109 A1 * | 1/2006 | Aitken ............... C03C 3/072 445/24 |

(Continued)

FOREIGN PATENT DOCUMENTS

| DE | 4128804 A1 * | 3/1993 | ............. C03C 3/122 |
| IL | WO 2011114335 A1 * | 9/2011 | ............... B32B 7/06 |

(Continued)

OTHER PUBLICATIONS

"Linear Thermal Expansion Coefficients of Metals and Allows," Material Expansion Coefficients, Chap. 17, pp. 17-1 to 17-1 (2002), published http://psec.uchicago.edu/thermal_coefficients/cte_metals_05517-90143.pdf.*

(Continued)

*Primary Examiner* — Randy Gulakowski
*Assistant Examiner* — Ha S Nguyen
(74) *Attorney, Agent, or Firm* — Crowell & Moring LLP

(57) ABSTRACT

The deterioration of the resin base materials in the bonded structure is prevented. In a bonded structure containing two base materials at least one of which is a resin, an oxide which contains either P or Ag, V, and Te, and are formed by softening on the two base materials, bond the two base materials. In addition, in a method for producing a bonded structure containing two base materials at least one of which is a resin containing: supplying an oxide containing either P or Ag, V, and Te to the base material; and applying electromagnetic waves to the oxide, whereby the oxide, which soften on the substrates, bond the two base material.

9 Claims, 6 Drawing Sheets

(51) Int. Cl.

| | |
|---|---|
| *C03C 8/08* | (2006.01) |
| *C03C 8/02* | (2006.01) |
| *C03C 8/24* | (2006.01) |
| *C03C 8/14* | (2006.01) |
| *H01L 21/48* | (2006.01) |
| *B32B 7/02* | (2006.01) |
| *B32B 7/04* | (2006.01) |
| *B32B 27/06* | (2006.01) |
| *C03C 8/18* | (2006.01) |
| *C03C 23/00* | (2006.01) |

(52) U.S. Cl.
CPC ............... *C03C 3/122* (2013.01); *C03C 3/21* (2013.01); *C03C 8/02* (2013.01); *C03C 8/08* (2013.01); *C03C 8/18* (2013.01); *C03C 8/24* (2013.01); *C03C 23/0025* (2013.01); *H01L 21/4807* (2013.01); *B32B 2264/102* (2013.01); *B32B 2307/30* (2013.01); *B32B 2307/54* (2013.01); *B32B 2457/14* (2013.01); *Y10T 428/24942* (2015.01)

(58) Field of Classification Search
CPC ............ B32B 2457/14; B32B 2307/30; B32B 2307/54; C03C 8/24; C03C 8/02; C03C 8/08; Y10T 428/24942
See application file for complete search history.

(56) References Cited

U.S. PATENT DOCUMENTS

2010/0180934 A1\* 7/2010 Naito .................... C03C 3/21
 136/252
2012/0321902 A1 12/2012 Kohara et al.

FOREIGN PATENT DOCUMENTS

| JP | 4-270140 A | | 9/1992 |
|---|---|---|---|
| JP | 5-175254 A | | 7/1993 |
| JP | 05170481 A | \* | 7/1993 |
| JP | 2010052990 A | \* | 3/2010 |
| JP | 2010-184852 A | | 8/2010 |
| JP | 2011-116619 A | | 6/2011 |
| JP | 2012106891 A | \* | 6/2012 |
| TW | 201036929 A1 | | 10/2010 |
| WO | WO 2011/108115 A1 | | 9/2011 |

OTHER PUBLICATIONS

DuPont Kapton "Polyimide film Techinical Data Sheet," pp. 1-5, copyright 2006.\*
Taiwanese Office Action dated Mar. 23, 2015 (eight pages).
International Search Report (PCT/ISA/210) dated Dec. 18, 2012 with English-language translation (two(2) pages).

\* cited by examiner

BONDED STRUCTURE AND PRODUCTION METHOD THEREFOR

TECHNICAL FIELD

The present invention relates to a bonded structure using resin base materials, and a production method there for.

BACKGROUND ART

Electric/electronic parts such as IC packages and image display devices use insulation base materials such as glass or ceramics. Recently, it has sometimes been required for the electric/electronic parts to have properties of flexibility, reduced weight, and impact resistance, and thus resin base materials may sometimes be used. In addition, resins have hitherto been often used for a printed wiring board, and the board is bonded to structures such as wirings, insulation layers, passive devices, active devices, radiators and protection cases, which are formed of a materials such as metals, ceramics, silicon, and resins.

The base material is typically bonded with a resin or glass. In the case of the resin, the resin is cured at a low temperature of room temperature to about 100° C., thereby performing the bonding. However, gas or moisture easily permeates the resin, and thus the resin has a low air tightness. On the other hand, in the case of the glass, gas or moisture permeates the glass only a little, and thus the glass has a high air tightness. As a glass composition showing a comparatively low softening and flowing temperature, for example, JP-2010-184852-A discloses a low melting point glass composition containing 45 to 65 mass %, in terms of an oxide of components forming the glass composition, of $V_2O_5$, 10 to 20 mass % of $P_2O_5$, 10 to 25 mass % of $TeO_2$, 5 to 15 mass % of $Fe_2O_3$, and 0 to 10 mass % of the total of $MnO_2$, ZnO, $WO_3$, $MO_3$ and BaO. According to JP-2010-184852-A, a low melting point glass composition having a softening point of 380° C. or lower can be provided, and it is said that a heat treatment temperature of sealing glass frits or a conductive glass paste using the same can be set at 400° C. or lower.

PRIOR ART DOCUMENTS

Patent Document

Patent Document 1: JP-2010-184852-A

SUMMARY OF THE INVENTION

Problem to be Solved by the Invention

However, even if the paste in JP-2010-184852-A is used, there is a problem in which the resin base materials are deteriorated by the heat treatment.

An object of the invention is to prevent deterioration of a resin base material of a bonded structure.

Means for Solving the Problem

To achieve the above object, in the present invention, a bonded structure includes two base materials at least one of which is a resin, and an oxide, which contain either P or Ag, V, and Te and are soften on the two base materials, bond the two base materials.

In addition, in a method for producing a bonded structure containing two base materials at least one of which is a resin, the method is characterized by containing the steps of: supplying an oxide containing either P or Ag, V, and Te to the base materials, and applying electromagnetic waves to the oxide, thereby bonding the two base materials with the oxide which soften on the substrates.

Effect of the Invention

According to the invention, the deterioration of the resin base materials in the bonded structure can be prevented.

MODE FOR CARRYING OUT THE INVENTION

Figure 1A:
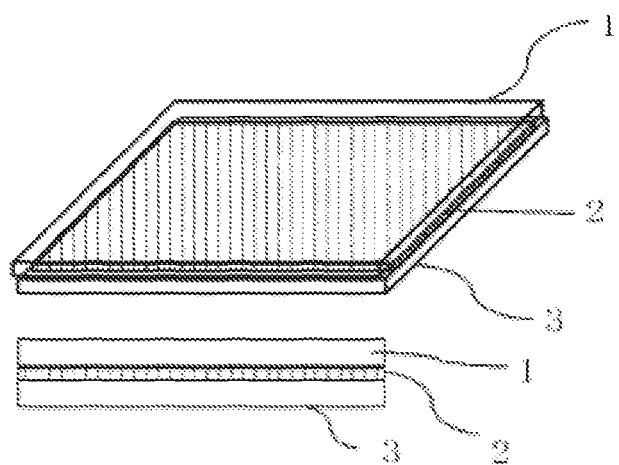
FIG. 1A shows a perspective view and a cross-sectional view illustrating a bonded structure in which a resin base material is bonded to another base material with oxides.

In the bonded structure, multiple base material are bonded to each other, and at least a part of the base materials are resin base materials. An oxide, which bonds the base materials to each other, contains V (vanadium), Te (tellurium) and P (phosphorus), or V, Te and Ag (silver). The oxide before bonding is in the state of glass (a glass composition), whereas the oxide after bonding does not necessarily keep the glass state, and may be in the state of a crystal.

When the glass composition contains V, Te and P, the glass composition has a glass transition temperature of about 230 to 340° C. and a softening and flowing temperature of about 300 to 440° C. The glass composition has a high absorption ability of electromagnetic waves and is easily heated, and the glass parts can be selectively heated and thus the resin base materials in the bonded structure are damaged only a little.

When the glass composition contains Ag, V and Te, it has a glass transition temperature of about 160 to 270° C. and a softening and flowing temperature of about 210 to 370° C.

Even if heating is performed by a heating method other than the irradiation of electromagnetic waves, accordingly, the resin base materials are damaged only a little.

When the glass composition described above further contains any of Fe, Sb, W, Ba, and K, in some cases, it is possible to more stably keep the glass structure. In addition, when Fe or Sb is contained, the absorption of electromagnetic waves becomes higher and heat is easily generated, and consequently the composition can more efficiently soften and flow. In order to make the composition soften and flow, it is necessary that the oxide is in the glass state, and in particular when W, Ba, or K is contained, crystallization of the glass composition can be inhibited when the electromagnetic waves are applied thereto.

It is effective that the electromagnetic wave used has a wavelength of 2000 nm or less (laser) or 1000 mm or less (microwaves), which are efficiently absorbed by the glass composition.

In the case of the oxide containing no Ag, when $V_2O_5$ is contained in the highest content in terms of the oxide, the electromagnetic waves can be easily absorbed. When $Fe_2O_3$ or $Sb_2O_3$ is contained, a laser having a wavelength within a range of, particularly, 2000 nm or less can be easily absorbed.

Te and P are components to cause vitrification, and when the components are contained, the glass composition can also be easily made soften and flow even by applying the electromagnetic waves. Although P is effective for decrease of a thermal expansion, when the $P_2O_5$ content (mass %), in terms of the oxide, is higher than that of $TeO_2$, a transition point $T_g$ easily increases, and thus it is better that the $P_2O_5$ content is adjusted to the same as or less than the $TeO_2$ content.

The effective composition range in the oxide is from 17 to 50 mass % of $V_2O_5$, from 20 to 32 mass % of $TeO_2$, and from 4 to 12 mass % of $P_2O_5$, mass % being in terms of the oxide, in addition to that the conditions described above are satisfied. The composition range which provides a more improved laser absorption property is preferably from 37 to 50 mass % of $V_2O_5$, 20 to 32 mass % of $TeO_2$, 6 to 12 mass % of $P_2O_5$, and 10 to 19 mass % of $Fe_2O_3$.

Alternatively, it is preferable that 17 to 50 mass % of $V_2O_5$, 25 to 40 mass % of $TeO_2$, 20 to 50 mass % of $Ag_2O$, and 85 mass % or more of $V_2O_5+TeO_2+Ag_2O$ are contained.

In the case of the glass composition containing Ag, V and Te, when the total contents of $Ag_2O$, $V_2O_5$, and $TeO_2$ are adjusted to 85 mass % or more in the oxide state and the $Ag_2O$ content and the $V_2O_5$ content are adjusted to 30 mass % or less and 25 mass % or more, respectively, then the obtained glass composition can have a particularly high resistance, which is effective to secure insulation between the base materials.

It is possible to adjust the thermal expansion coefficient to a pre-determined value by mixing the glass composition with filler such as $SiO_2$, $ZrO_2$, $Al_2O_3$, $Nb_2O_5$, $ZrSiO_4$, $Zr_2(WO_4)(PO_4)_2$, cordierite, mullite or eucryptite depending on the material of the base material, thereby increasing the bonding strength or the strength of the glass composition itself. When there is a great difference in the thermal expansion coefficient between the base materials to be bonded, the bonding strength can be increased by overlapping a glass composition having a different thermal expansion coefficient.

It is possible to provide thermal conductivity or electrical conductivity to between the base materials to be bonded, if necessary, by mixing the glass composition with a conductive material such as Ag, Au, Pt, Cu, Al, Sn, Zn, Bi, or In.

The addition of metal particles as the conductive material can relieve a thermal stress when there is a great difference in the thermal expansion coefficient between the resin base material and the other base material, because the metal particles plastically deform, and consequently it is possible to enhance the bonding strength.

It is possible to further enhance the bonding property to the resin base material by mixing the glass composition with a resin additive.

The glass compositions are all lead-free from environmental consideration. The term "lead-free" herein means that it is acceptable to contain prohibited materials provided in RoHS Directive (Restriction of Hazardous Substances: enforced on Jul. 1, 2006) in the values specified or less.

Embodiments of the present invention are hereinafter described in detail with reference to the drawings. The present invention, however, is not limited to the embodiments described herein, and it is possible to appropriately combine or modify them without changing the scope of the invention.

FIG. 1 shows schematic views of bonded structures. FIG. 1 shows structures in which a resin base material 1 and another base material 2 are bonded to each other through a glass composition. The other base material 2 herein may be a resin base material or a base material different from the resin, such as glass, a ceramic, a metal, silicon, or a carbide. The structure may be any of a structure in which whole surfaces of substrates having the same shape are bonded to each other as illustrated in FIG. 1A; a structure in which the bonding is performed so that a space is left inside as illustrated in FIG. 1B; a structure in which substrates whose sizes are different from each other are bonded to each other as illustrated in FIG. 1C; and a structure in which base materials, at least one of which is not a plate, are bonded to each other as illustrated in FIG. 1D.

It is necessary that the glass composition softens and flows by heating the glass composition, when the bonding is performed. When a material having a high heat resistance, such as polyimide, is used as the resin base material 1 (including the substrate), the material may be heated disposing it in a high temperature environment such as an electric furnace; whereas when a material having a poor heat resistance is used, it is effective to selectively heat the glass composition part using electromagnetic waves.

The resin base material is not particularly limited, and both crystal resins and amorphous resins can be used. For example, polyethylene, polyvinyl chloride, polypropylene, polystyrene, polyvinyl acetate, ABS resins, AS resins, acrylic resins, phenol resins, polyacetal resins, polyimide, polycarbonate, modified polyphenylene ethers (PPE), polybutylene terephthalate (PBT), polyacrylate, polysulfone, polyphenylene sulfide, polyether ether ketone, polyimide resins, fluororesin, polyamide imide, epoxy resins, polyesters, polyvinyl esters, fluororubber, silicone rubber, acrylic rubber, and the like, may be used.

Figure 1B:
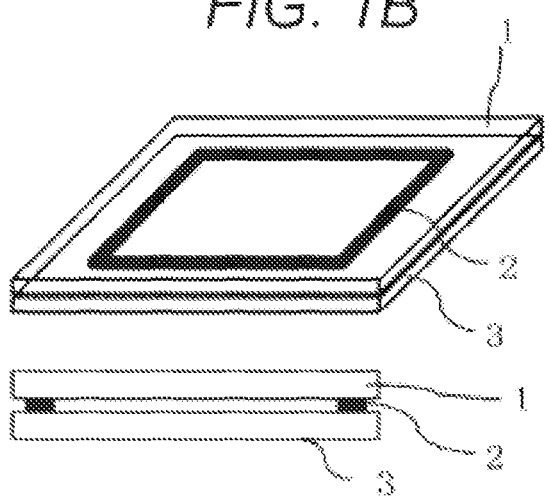
FIG. 1B shows a perspective view and a cross-sectional view illustrating another bonded structure.
Figure 1C:
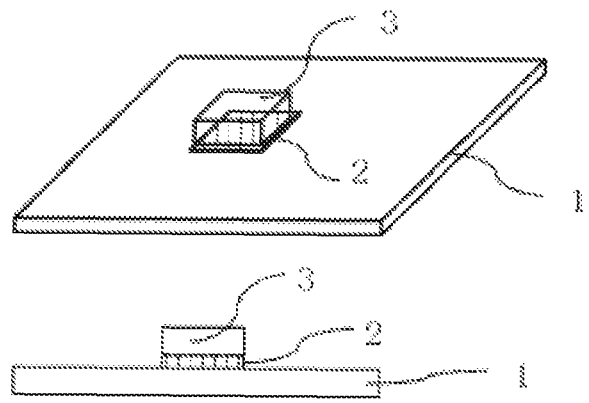
FIG. 1C shows a perspective view and a cross-sectional view illustrating another bonded structure.
Figure 1D:
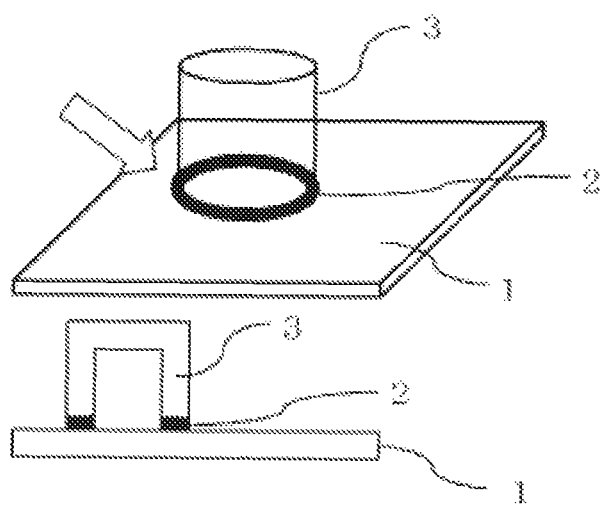
FIG. 1D shows a perspective view and a cross-sectional view illustrating another bonded structure.

When as a wavelength of an electromagnetic wave, a range in which an absorptance is low in the resin base material 1 and an absorptance is high in the glass composition 2 is selected, selective heating can be performed. In the bonded states as illustrated in FIGS. 1A to 1C, it is necessary that the electromagnetic waves can permeate at least one of the substrates. In that case, the glass composition 2 can soften and flow by applying the electromagnetic waves from the side of the base material through which the electromagnetic waves can pass, whereby the bonding can be attained. In the bonded state as illustrated in FIG. 1D, even if the electromagnetic waves cannot permeate the both base materials, when electromagnetic waves capable of limiting an irradiation range, such as a laser, are used, the glass composition can soften and flow in a manner in which the heating of the base materials is inhibited by applying the laser, for example, in a direction of an arrow 4 in the drawing. Alternatively, in a case where one of the base materials is a material having a high thermal conductivity, such as a metal or a part of ceramics, a method may be taken in which laser is applied to a region near to the glass composition to heat the glass composition by thermal conduction of the base material. In either case, it is important that the glass composition is selectively heated so that the temperature of the resin base material 1 is adjusted to a temperature lower than the heat resistant temperature thereof.

As the wavelength of the electromagnetic wave used, laser having a wavelength within a range of 400 to 2000 nm, or microwaves having a wavelength within a range of 0.1 to 1000 mm is effective. When the laser having a wavelength of 400 nm or more is used, it is difficult to deteriorate the resin of the base material. On the other hand, when the laser having a wavelength of 2000 nm or less, even if the resin of the base material contains moisture, there is no concern in which the moisture generates heat, thereby melting the resin. When the microwaves having a wavelength of 0.1 to 1000 mm are applied, semiconducting conductivity is provided to the oxide glass to absorb the electromagnetic waves, whereby selective heating can be performed. The source of microwaves is not particularly limited, and a source of 2.45 GHz band, such as a household microwave oven, may be used.

Figure 2:
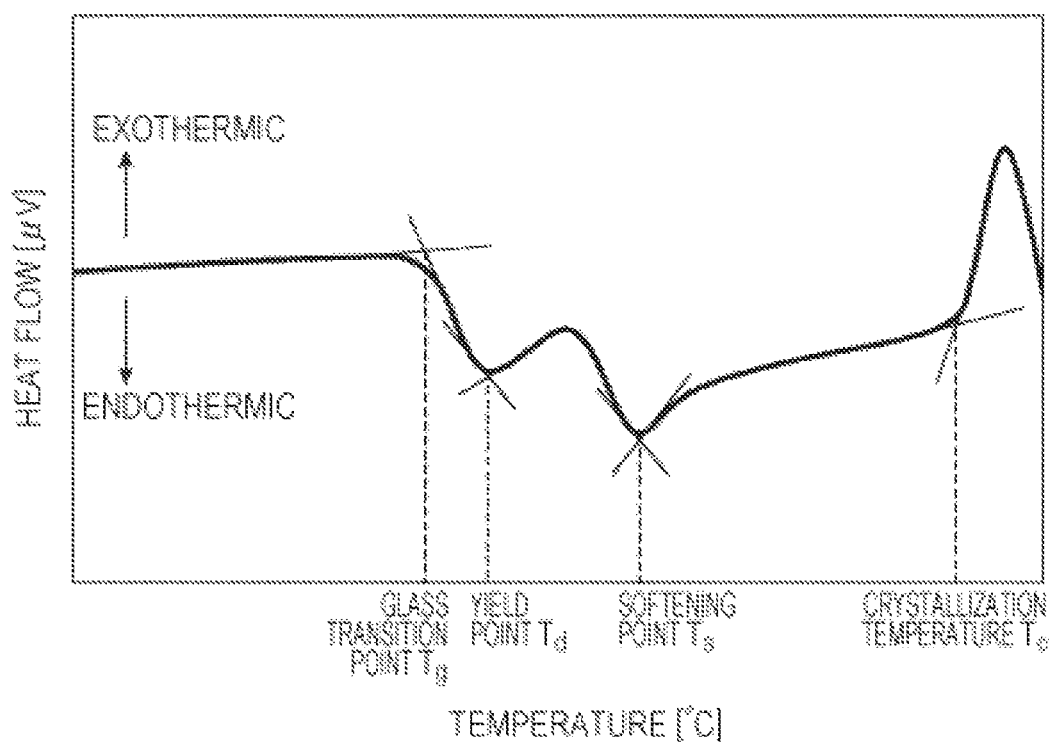
FIG. 2 shows one example of DTA curves obtained by a differential thermal analysis of a glass composition.

Table 1 shows properties of the oxides in the invention. In Table, glass transition points are shown, and a measurement method thereof is as follows: Produced glass is pulverized until a mean volume particle diameter is 20 μm or less, and a differential thermal analysis (DTA) thereof is performed at a temperature elevation rate of 5° C./minute until the temperature reaches 550° C., thereby measuring a glass transition point ($T_g$). An alumina power is used as a standard sample, and Al is used as a sample vessel. FIG. 2 shows a typical DTA curve of a glass composition. As shown in the drawing, a starting temperature of a first endothermic peak is defined as a glass transition point ($T_g$). In addition, as the first endothermic peak temperatures, a yield point ($M_g$) is obtained; as a second endothermic peak temperatures, a softening point ($T_s$) is obtained; and as a crystallization temperature, a starting temperature ($T_c$) of an exothermic peak is obtained. The bonding temperature depends on various factors such as a particle diameter of glass, pressurizing conditions and retention times during the bonding, and it cannot be generally decided. It is necessary that the temperature is heated to at least a temperature higher than the softening point $T_s$, which corresponds to a viscosity of 107.65 poises. The softening point $T_s$ is a temperature about 50 to 100° C. higher than the glass transition temperature $T_g$, though it depends on the glass composition.

For example, properties of some typical glass compositions are shown in Table 2 as Comparative Example. Although there are some compositions having a low glass transition temperature, it is substantially impossible to perform selective heating because of the poor electromagnetic wave absorption property, and bonding capable of reducing the thermal damage of the resin base material, as described above, can be applied to only some high heat-resistant resin base materials.

Figure 3:
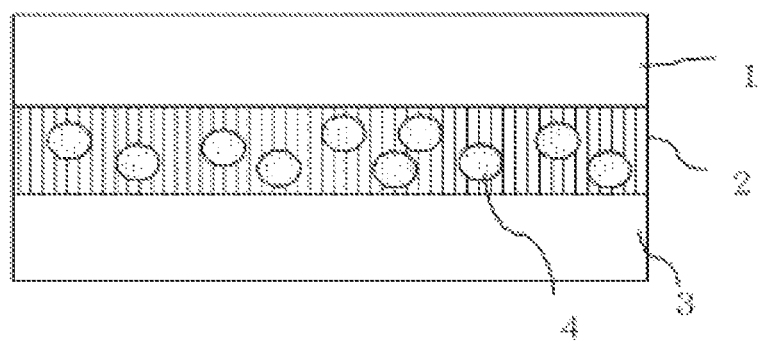
FIG. 3 shows a cross-sectional view illustrating a bonded structure when filler is added.

FIG. 3 shows a cross-sectional view illustrating a bonded structure in which filler is added to the oxide. The filler 4 has an arrangement in which the filler 4 is dispersed inside the oxide 2. It is necessary that the filler 4 is significantly smaller than a thickness of a bonding layer formed of the oxide 2. The filler 4 is preferably mixed in an amount of 5 to 50 mass %. When the amount of the filler 4 is less than 5%, the thermal expansion coefficient of the oxide 2 is changed only a little, and thus it cannot be expected that great effects are influenced to the bonding property. When the amount of the filler 4 is more than 50 mass %, the fluidity of the oxide 2 is remarkably reduced, and the good bonding cannot be expected. It is preferable, accordingly, that the amount of the filler 4 is adjusted to a range of 5 to 50 mass %.

The oxide 2 may contain a conductive material 5. FIG. 4 shows a cross-sectional views illustrating a bonded structure when a metal is added. As the conductive material 5, Ag, Au, Pt, Cu, Al, Sn, Zn, Bi, In, and alloy thereof can be thought. The thermal conductivity of the glass composition 2 shown in Table 1 is typically about 0.5 W/mK, and the electric resistivity thereof is typically from about $10^7$ to $10^{11}$ Ωcm. The composition 2 is, accordingly, a comparatively good thermal insulator and electric insulator. On the other hand, it is sometimes required to conduct electricity or heat from one base material to be bonded to the other base material, depending on the use. In this embodiment, the thermal or electric conductivity is provided to the glass composition 2, which performs bonding, by mixing metal particles as the conductive material 5. It is necessary that the thickness of the conductive material 5 is significantly smaller than that of the bonding layer formed of the glass composition 2.

Figure 4A:
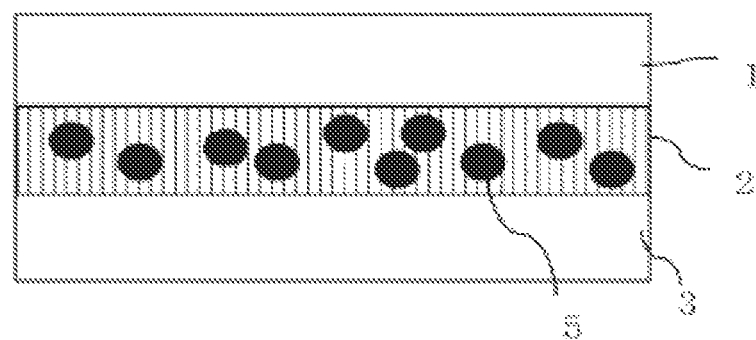
FIG. 4A shows a cross-sectional view illustrating a bonded structure when a metal is added.
Figure 4B:
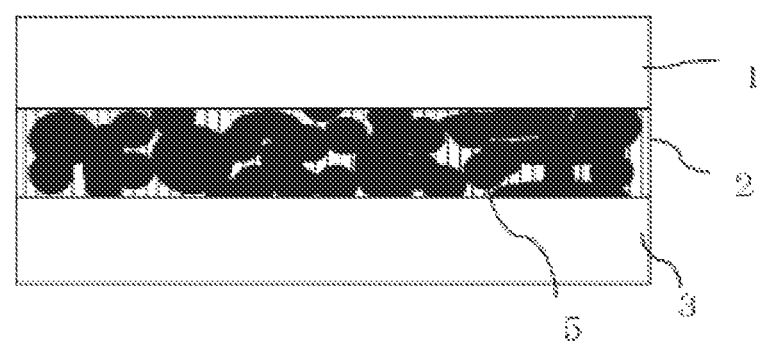
FIG. 4B shows a cross-sectional view illustrating a bonded structure when a metal is added.

The thermal or electric conductivity can be provided only by mixing the conductive material, as shown in FIG. 4A, but it is more preferable that the conductive material 5 is melted or sintered by heating so that the glass softens and flows to bind the conductive material particles to each other, as shown in FIG. 4B, whereby the very good thermal conductivity or electric conductivity can be obtained. As the conductive material 5, accordingly, materials having a low melting point such as Sn and materials which is easily sintered such as Ag are particularly preferable. For example, when Ag particles are mixed in an amount of about 50 to 95 vol %, then the glass composition 2 has a thermal conductivity which is 10 to 50% of the thermal conductivity of Ag of 425 W/mK, and an electric resistivity which is about 2 to 10 times of the electric resistivity of Ag of 4.1 μΩcm. Such a glass composition, accordingly, acquires the thermal or electric conductivity remarkably better than that obtained in a case where the metal filler 5 is not mixed.

On the other hand, when there is a great difference in the thermal expansion coefficient between the resin base material 1 and the other bonding material, the metal particles can relieve the thermal stress because the metal plastically deform, and the metal particles are also effective for increasing the bonding strength. In this use, it is not necessary that the metal particles are melted or sintered to bond the metal particles to each other. The addition amount thereof is preferably from about 10 to 50%.

When the composition of the glass composition 2 in FIG. 1 is adjusted so that the $Ag_2O$ content is 30 mass % or less, and the $V_2O_5$ content is 25 mass % or more in the oxide state (Nos. 11 to 15, 17 to 21, 27, 29, and 30 in Table 1), the glass composition has an electric resistivity of $10^9$ Ωcm or more, which is particularly effective in a use to obtain the insulation between the bond base materials.

Figure 5A:
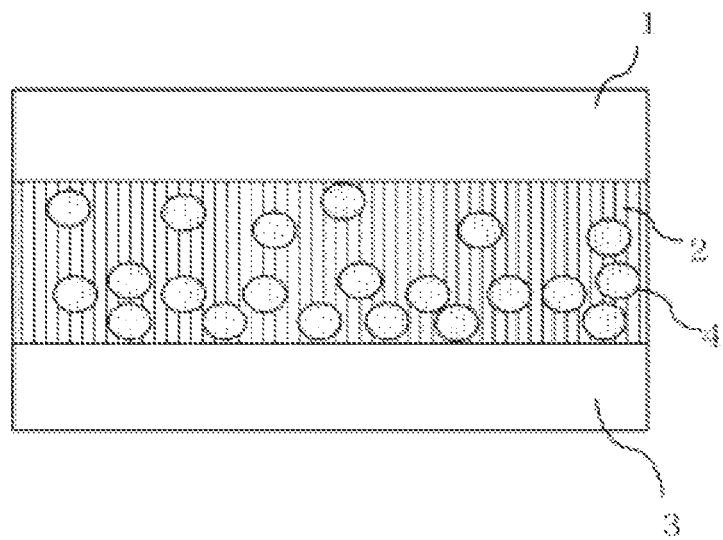
FIG. 5A shows a cross-sectional view illustrating a bonded structure when thermal expansion coefficients of oxides are tilted.
Figure 5B:
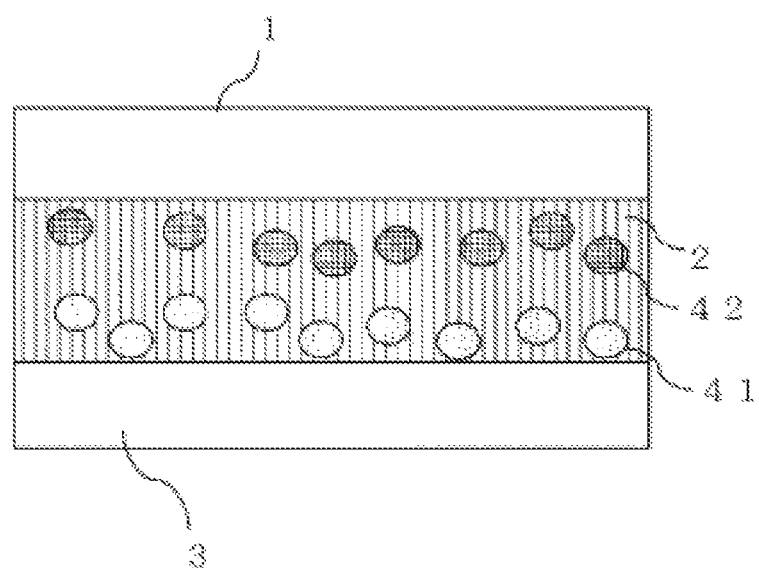
FIG. 5B shows a cross-sectional view illustrating a bonded structure when thermal expansion coefficients of oxides are tilted.

FIG. 5 shows schematic views illustrating another embodiment. In this embodiment, a resin base material 1 is bonded to another base material 3 through oxide 2, wherein the oxide 2 contains filler 4. As shown in FIG. 5A, an amount of the filler 4 on a side near the resin base material 1 is different from that of the filler 4 on a side near the base material 3. Alternatively, as shown in FIG. 5B, a material of the filler 41 on a side near the base material 3 is different from that of the filler 42 on a side near the resin base material 1. In such a structure, it is possible to enhance the bonding strength between the base materials whose thermal expansion coefficients are greatly different from each other by making a difference in the thermal expansion coefficient of the oxide 2 between the one base material side and the other base material side.

The oxide 2 may contain a resin additive. In such a case, the bonding property to, particularly, the resin base material 1 may sometimes be improved. In addition, the oxide 2 does not easily plastically deform, and thus when there is a big difference in the thermal expansion coefficient from the base material, the bonding strength may sometimes be reduced. However, even if the thermal expansion coefficient is greatly different from that of the base material, the mixing with a resin capable of causing plastic deformation or elastic deformation can inhibit the reduction of the bonding strength due to occurrence of stress relief. It is preferable that the resin additive is dispersed in the oxide in an amount of 5 to 50 vol %.

The resin additive in the invention is not particularly limited, and any of crystalline additives and amorphous additives may be used. For example, polyethylene, polyvinyl chloride, polypropylene, polystyrene, polyvinyl acetate, ABS resins, AS resins, acrylic resins, phenol resins, polyacetal resins, polyimide, polycarbonate, modified polyphenylene ethers (PPE), polybutylene terephthalate (PBT), polyacrylate, polysulfone, polyphenylene sulfide, polyether ether ketone, polyimide resins, fluororesin, polyamide imide, epoxy resins, polyesters, polyvinyl esters, fluororubber, silicone rubber, acrylic rubber, and the like, may be used.

In the embodiments shown in FIGS. 1 to 5, the oxide 2 may be reacted with the base materials 1 and 2, the filler 4, the conductive material 5, and the resin additive to cause crystallization. Though the glass composition is originally used, accordingly, it is not necessary that the bonding layer is amorphous in the final bonded state.

The present invention is described in more detail using Examples below. However, the present invention is not limited to Examples cited therein, and they may be appropriately combined.

EXAMPLE 1

In this Example, a glass composition having a composition shown in Table 1 was produced. Starting materials were weighed in a mass ratio in terms of the oxide, shown in Table. An oxide powder (a purity of 99.9%), manufactured by Kojundo Chemical Lab. Co., Ltd., was used as the starting material. In some samples, $Ba(PO_3)_2$, manufactured by RASA Industries, Ltd., was used as a Ba source and a P source. The starting materials were mixed and the mixture was put in a platinum crucible. When an $Ag_2O$ ratio was 40 mass % or more in the starting materials, an alumina crucible was used. When the materials were mixed, they were mixed in the crucible using a metal spoon, in order to avoid that the starting material powders absorbed extra moisture. The crucible containing the starting material powders mixed was set in a glass melting furnace, and the powders were heated and melted. The temperature was elevated at a temperature elevation rate of 10° C./minute, and the crucible was kept at a predetermined temperature (700 to 950° C.) for one hour while the melted glass was stirred. After that, the crucible was taken out from the glass melting furnace, and the glass was casted in a graphite mold, which was previously heated to 150° C.

Next, the casted glass was moved to a strain-removing furnace, which was previously heated to an annealing temperature for removing strain, and it was kept for one hour as it was to remove strain. Then, it was cooled to room temperature at a rate of 1° C./minute. The glass, cooled to room temperature, was roughly pulverized to produce frits of a glass composition. The frits of the glass composition had a mean volume diameter of 20 μm or less. A glass transition temperature thereof was measured by DTA. Each glass composition had a glass transition temperature shown in Table 1.

EXAMPLE 2

In this Example, for producing a bonded structure, the frits of the glass composition, produced in Example 1, were formed into a paste. First, the frits of the glass composition were pulverized in a jet mill so as to have a mean volume diameter of 2 μm or less. Each of Nos. 1 to 10 glass compositions in Table 1 was mixed with a solvent to which 4% of a resin binder was added to obtain the paste. Here, ethyl cellulose was used as the resin binder, and butyl carbitol acetate was used as a solvent. Butyl carbitol acetate is not so much reacted with Nos. 1 to 10 glass compositions. However, when the solvent is used alone, then the viscosity is low and a coating property is poor. For that reason, the resin binder was added. Ethyl cellulose can be volatilized by heating it to about 300° C., and thus it is possible to remove ethyl cellulose without making Nos. 1 to 10 glass compositions soften and flow. The pastes using Nos. 1 to 10 glass compositions, accordingly, were coated on the base materials to be bonded, and then heated to about 300° C. to remove the solvent and the resin binder.

On the other hand, only the solvent was mixed with Nos. 11 to 33 glass compositions to obtain pastes. Here, α-terpineol was used as the solvent. α-Terpineol is not so much reacted with Nos. 11 to 33 glass compositions, and has a comparatively high viscosity, and thus it has a good coating property even if a resin binder is not added. α-Terpineol cannot be used as the solvent for Nos. 1 to 10 glass compositions, because it is reacted therewith. α-Terpineol can be volatilized by heating it to about 100 to 200° C., and thus it is possible to remove it without making Nos. 11 to 33 glass compositions soften and flow. The pastes using Nos. 11 to 33 glass compositions, accordingly, were coated on the base materials to be bonded, and then heated to about 200° C. to remove the solvent.

EXAMPLE 3

In this Example, a bonded structure of resin base materials, as shown in FIG. 1B, was produced by means of laser heating. Here, two polycarbonate substrates were prepared. The paste of the glass composition, produced in Example 2, was coated on one polycarbonate film in a manner in which sides of a square were traced. The composition of the glass composition was adjusted to 20 mass % $V_2O_5$-35 mass % $TeO_2$-45 mass % $Ag_2O$. α-Terpineol was used as a solvent. The substrate on which the paste was coated was heated to 100° C. to remove the solvent. The substrate was put on another substrate on which the paste was not coated so that the surface coated with the paste was faced down. A laser was scanned along the surface coated with the paste. The bonding was tested setting the wavelength of the laser at 400 nm, 800 nm, or 1100 nm. In any case, the glass composition softened and flowed, and the resin base materials were firmly bonded to each other without deterioration thereof.

Figure 6:
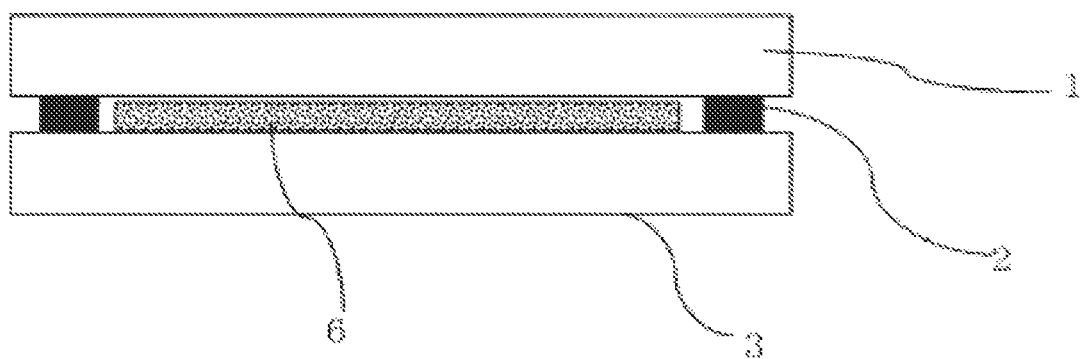
FIG. 6 shows a cross-sectional view illustrating a bonded structure when a device is sealed in a resin base material.

In this Example, various devices 6 can be disposed between the two resin base materials 1 and 3, as shown in FIG. 6. In addition, the structure is sealed with the two resin base materials 1 and 3 and the glass composition 2, and thus the devices 6 disposed inside thereof can be protected from moisture and dust. The form of this Example can be applied to and developed for image display apparatus, for example, by using OLED as the device.

EXAMPLE 4

In this Example, a bonded structure of resin base materials was produced by means of microwave heating. Here, two polyimide substrates were prepared. The paste of the glass composition, produced in Example 2, was coated on the whole surface of one polyimide film, as shown in FIG. 1A. The composition of the glass composition was adjusted to 20 mass % $V_2O_5$-35 mass % $TeO_2$-45 mass % $Ag_2O$. α-Terpineol was used as a solvent. The substrate on which the paste was coated was heated to 100° C. to remove the solvent. The polyimide film on which the paste was coated was put on another polyimide film on which the paste was not coated so that the surface coated with the paste was faced down. Using a microreactor, manufactured by Shikoku Instrumentation Co., Ltd., microwaves having a 2.45 GHz band (a wavelength: 125 mm) was applied. As a result, the glass composition softened and flowed, and the resin base materials were firmly bonded to each other without deterioration thereof.

In this Example, a composite sheet of the glass and the resin was formed. The composite sheet has both lightness, which is peculiar to the resin, and a gas barrier property, which is peculiar to the glass. When the composite sheet is applied to a sealing structure as in Example 3, the electric/electronic parts disposed inside can be protected.

EXAMPLE 5

Figure 7:
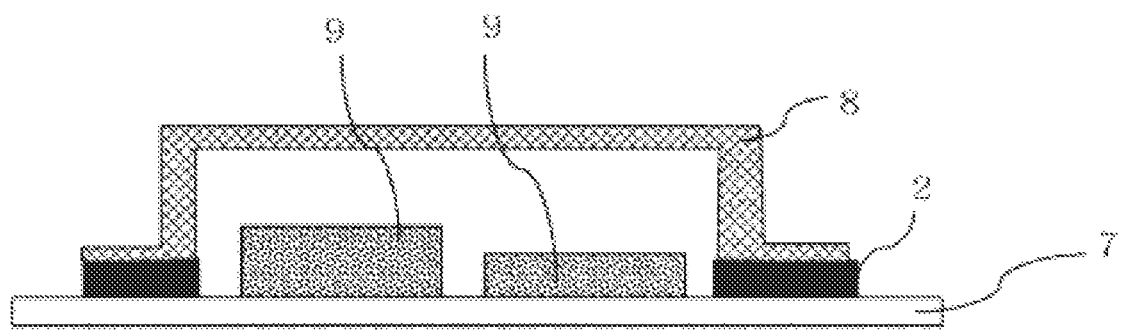
FIG. 7 shows a cross-sectional view illustrating a packaged electric/electronic part in which devices on a ceramic substrate is protected by a resin case.

In this Example, a resin case 8 is bonded to a ceramic base material 7, as shown in FIG. 7, by means of laser heating. Here, an $Al_2O_3$ base material and a polyimide case were prepared. The paste of the glass composition, produced in Example 2, was coated on the $Al_2O_3$ base material in a manner in which sides of a square were traced. The composition of the glass composition was adjusted to 43 mass % $V_2O_5$-30 mass % $TeO_2$-15 mass % $Fe_2O_3$-12 mass % $P_2O_5$. For pasting, an ethyl cellulose resin binder and a butyl carbitol acetate solvent were added. Next, the $Al_2O_3$ base material was heated at 400° C. for 10 minutes to remove the resin binder and the solvent and to make the glass composition 2 once soften and flow. The polyimide case was put thereon, and then the part coated with the paste was scanned with a laser from above the polyimide case. The wavelength of the laser was adjusted to 1100 nm. As a result, the polyimide case was not deteriorated, and the $Al_2O_3$ base material and the polyimide case were firmly bonded to each other.

In this Example, the polyimide case plays a role to protect a packaged electric/electronic part in which a wiring 9, a passive device 9, an active device 9, and the like are disposed on the $Al_2O_3$ base material, which is an insulation base material, from dust or moisture in the outside.

The typical thermal expansion coefficients of the $Al_2O_3$ base material and the polyimide case are respectively 7 ppm/°C. and 25 ppm/°C. The glass composition used in this Example has a thermal expansion coefficient of 10 ppm/°C. The polyimide case is comparatively soft; whereas the $Al_2O_3$ base material causes hardly plastic deformation. Cracks, accordingly, may sometimes be generated at an interface between the glass composition 2 and the $Al_2O_3$ base material due to the difference in the thermal expansion coefficient between them, depending on the structure. Then, 30 vol % of $Zr_2(WO_4)(PO_4)_2$ was added to the glass composition 2, and the similar bonded structure as above was produced using it.

As $Zr_2(WO_4)(PO_4)_2$ has a negative thermal expansion coefficient, it plays a role to approach the thermal expansion coefficient of the glass composition 2 toward that of the $Al_2O_3$ substrate. It was found that even if $Zr_2(WO_4)(PO_4)_2$ was added, a good bonding occurred. It is not necessary to use $Zr_2(WO_4)(PO_4)_2$ as the filler for adjusting the thermal expansion coefficient, and filler of $SiO_2$, $ZrO_2$, $Al_2O_3$, $Nb_2O_5$, $ZrSiO_4$, $Zr_2(WO_4)(PO_4)_2$, cordierite, mullite, or eucryptite may be used according to the kind of the base material.

In this case, a method can also be used in which the paste of the glass composition to which filler is added is coated on an $Al_2O_3$ base material, it is dried, then the paste of the glass composition 2 containing no filler is coated, it is dried, a polyimide case is put thereon, and the laser is scanned. In this case, it is possible that the reduction of the thermal expansion coefficient occurs only on the side near the $Al_2O_3$ base material, and it is possible to prevent the increase of the difference in the thermal expansion coefficient between the polyimide case and the glass composition 2 by the addition of the filler.

In this Example, the thermal expansion coefficient of the other base material bonded to the resin base material is smaller than the thermal expansion coefficient of the resin base material, but the bonding can be similarly performed even in a case where the thermal expansion coefficient of the other base material is higher than the thermal expansion coefficient of the resin base material.

EXAMPLE 6

Figure 8:
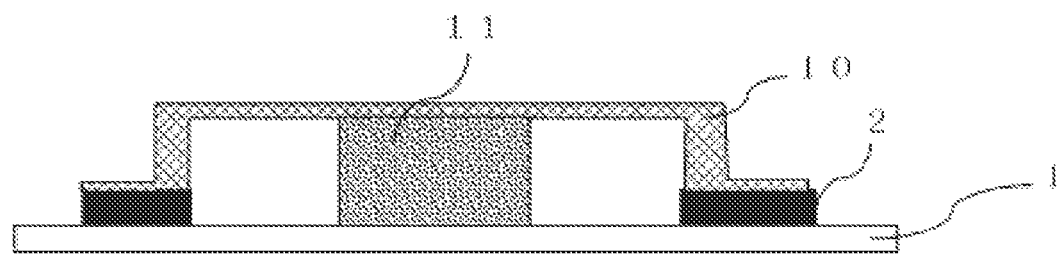
FIG. 8 shows a cross-sectional view illustrating an electric/electronic part in which semiconductor devices on a resin base material are sealed with a cap-shaped copper radiator.

In this Example, a radiator 10 was bonded to a resin base material 1 by means of laser heating in a form as shown in FIG. 8. Here, a glass epoxy resin base material and a cap-shaped copper radiator 10 were prepared. The paste of the glass composition, produced in Example 2, was coated on the glass epoxy substrate in a circle. The composition of the glass composition was adjusted to 20 mass % $V_2O_5$-35 mass % $TeO_2$-45 mass % $Ag_2O$. Paste of a glass composition to which 30 vol % of Sn, or 30 vol % of acrylic rubber was added as a thermal stress-relieving material, was also tested.

α-Terpineol was used as a solvent. The base material coated with the paste was heater to 100° C. to remove the solvent. A copper cap was put on the part coated with the paste, and a laser was scanned along an edge near the base material of the copper cap. The wavelength of the laser was adjusted to 515 nm. The glass softened and flowed by the irradiation of the laser, and the copper cap and the base material could be firmed bonded to each other without deterioration of the base material. In particular, the bonding property was better in the composition to which Sn or the acrylic rubber was added. As described above, the metal and the resin, which are mixed as the thermal stress-relieving material, are not necessarily limited to Sn and the acrylic rubber.

The form of this Example can be applied to a use in which a semiconductor chip 11 is inserted into the radiator 10, and heat, generated on the operation of semiconductor chips, is quickly released from the surface of the radiator 10, as shown in FIG. 8. For example, it can be applied to and developed for hard disks. In addition, the past of this Example can also be used at a bonded part of the semiconductor chip 11 and the resin base material 1.

10: radiator
11: semiconductor chip

The invention claimed is:
1. A bonded structure comprising:
two base materials, at least one of which is a resin, and
an oxide formed of lead-free glass containing V, Te, and Ag softened on the two base materials to bond the two base materials, wherein
the oxide contains $V_2O_5$, $TeO_2$, and $Ag_2O$, and any of Fe, Sb, W, Ba, and K, and an oxide mass % of $V_2O_5$ + an oxide mass % of $TeO_2$ + an oxide mass % of $Ag_2O$ is

TABLE

| Glass No. | $V_2O_5$ | $TeO_2$ | $Fe_2O_3$ | $P_2O_5$ | $Ag_2O$ | $WO_3$ | BaO | $Sb_2O_3$ | $K_2O$ | Glass transition temperature (°C.) | Laser absorption property | Microwave absorption property | |
|---|---|---|---|---|---|---|---|---|---|---|---|---|---|
| 1 | 50 | 32 | 10 | 8 | — | — | — | — | — | 263 | ☉ | ○ | Example |
| 2 | 50 | 30 | 10 | 6 | — | 4 | — | — | — | 257 | ☉ | ○ | Example |
| 3 | 45 | 30 | 15 | 10 | — | — | — | — | — | 308 | ☉ | ○ | Example |
| 4 | 45 | 25 | 15 | 10 | — | 5 | — | — | — | 316 | ☉ | ○ | Example |
| 5 | 43 | 30 | 15 | 12 | — | — | — | — | — | 318 | ☉ | ○ | Example |
| 6 | 37 | 33 | 19 | 11 | — | — | — | — | — | 336 | ☉ | ○ | Example |
| 7 | 38 | 30 | — | 5.8 | — | 10 | 11.2 | — | 5 | 276 | ○ | ○ | Example |
| 8 | 55 | 20 | — | 10 | — | — | 5 | 10 | — | 313 | ☉ | ○ | Example |
| 9 | 45 | 25 | — | 10 | — | — | 5 | 15 | — | 338 | ☉ | ○ | Example |
| 10 | 45 | 30 | — | 10.3 | — | 10 | 4.7 | — | — | 286 | ○ | ○ | Example |
| 11 | 30 | 30 | — | 4.8 | 30 | — | 5.2 | — | — | 222 | ○ | ○ | Example |
| 12 | 30 | 30 | — | 5 | 30 | 5 | — | — | — | 230 | ○ | ○ | Example |
| 13 | 25 | 30 | — | 4.8 | 30 | 5 | 5.2 | — | — | 223 | ○ | ○ | Example |
| 14 | 25 | 30 | — | 7.2 | 30 | — | 7.8 | — | — | 228 | ○ | ○ | Example |
| 15 | 30 | 30 | — | 4.8 | 25 | 5 | 5.2 | — | — | 236 | ○ | ○ | Example |
| 16 | 25 | 25 | — | — | 50 | — | — | — | — | 204 | ○ | ○ | Example |
| 17 | 30 | 30 | — | 5 | 30 | — | — | — | — | 235 | ○ | ○ | Example |
| 18 | 25 | 30 | — | 10 | 30 | — | — | — | — | 266 | ○ | ○ | Example |
| 19 | 25 | 30 | — | 5 | 30 | 5 | — | — | — | 249 | ○ | ○ | Example |
| 20 | 25 | 30 | — | 5 | 30 | 10 | — | — | — | 236 | ○ | ○ | Example |
| 21 | 30 | 30 | — | 4.8 | 25 | 5 | 5.2 | — | — | 237 | ○ | ○ | Example |
| 22 | 20 | 30 | — | 4.8 | 35 | 5 | 5.2 | — | — | 204 | ○ | ○ | Example |
| 23 | 17 | 30 | — | 4.8 | 38 | 5 | 5.2 | — | — | 197 | ○ | ○ | Example |
| 24 | 17 | 30 | — | — | 43 | 5 | 5 | — | — | 177 | ○ | ○ | Example |
| 25 | 20 | 35 | — | — | 45 | — | — | — | — | 163 | ○ | ○ | Example |
| 26 | 17 | 40 | — | — | 43 | — | — | — | — | 169 | ○ | ○ | Example |
| 27 | 40 | 40 | — | — | 20 | — | — | — | — | 218 | ○ | ○ | Example |
| 28 | 20 | 30 | — | — | 45 | 5 | — | — | — | 169 | ○ | ○ | Example |
| 29 | 45 | 30 | — | — | 20 | 5 | — | — | — | 224 | ○ | ○ | Example |
| 30 | 40 | 35 | — | — | 25 | — | — | — | — | 212 | ○ | ○ | Example |
| 31 | 18 | 34 | — | — | 43 | — | 5 | — | — | 167 | ○ | ○ | Example |
| 32 | 40 | 25 | — | — | 35 | — | — | — | — | 235 | ○ | ○ | Example |
| 33 | 30 | 25 | — | — | 45 | — | — | — | — | 216 | ○ | ○ | Example |
| 34 | 40 | | | 25 | 20 | 10 | 5 | — | — | 338 | ○ | ○ | Example |
| 35 | 50 | | | | 30 | 20 | | — | — | 326 | ○ | ○ | Example |
| 36 | 45Ag2O—45P2O5—10ZnO | | | | | | | — | — | 241 | X | X | Comparative Example |
| 37 | 40Ag2O—20P2O5—30TeO2—10BaO | | | | | | | — | — | 250 | X | X | Comparative Example |
| 38 | 50PbO—15B2O3—15SiO2—5TiO2—10ZnO—5Al2O3 | | | | | | | — | — | 522 | X | X | Comparative Example |
| 39 | 50Bi2O3—20B2O3—5SiO2—15BaO—10ZnO | | | | | | | — | — | 489 | X | X | Comparative Example |

DESCRIPTION OF REFERENCE NUMERALS

1: resin base material
2: oxide (glass composition)
3: base material
4,41: filler
5: conductive material
6: devices
7: ceramic base material
8: resin case
9: wiring (passive device, active device)

greater than or equal to 85 mass % and less than 100 mass % of a total mass of the oxide, wherein the oxide further comprises filler mixed with the oxide and providing the oxide with an adjusted thermal expansion coefficient, wherein the two base materials have different thermal expansion coefficients, and the adjusted thermal expansion coefficient of the oxide adjacent one of the base materials having a higher thermal expansion coefficient has a higher thermal expansion coefficient than the adjusted thermal expansion coefficient of the oxide adjacent the other of the base materials having a lower thermal expansion coefficient.

2. The bonded structure according to claim 1, wherein the oxide has a transition point of 340° C. or lower.

3. The bonded structure according to claim 1, wherein the oxide has a transition point of 270° C. or lower.

4. The bonded structure according to claim 1, wherein the oxide mass % of $V_2O_5 \geq 25$ mass % of the total mass of the oxide, and the oxide mass % of $Ag_2O \leq 30$ mass % of the total mass of the oxide.

5. The bonded structure according to claim 1, wherein the filler contains any of $SiO_2$, $ZrO_2$, $Al_2O_3$, $Nb_2O_5$, $ZrSiO_4$, $Zr_2(WO_4)(PO_4)_2$, cordierite, mullite, and eucryptite.

6. The bonded structure according to claim 1, wherein the oxide is softened by irradiation of electromagnetic waves.

7. The bonded structure according to claim 6, wherein the electromagnetic waves are produced by a laser having a wavelength of 2000 nm or less, or a microwave having a wavelength of 0.1 to 1000 mm.

8. The bonded structure according to claim 1, wherein 5 to 50 vol % of a resin additive is dispersed in the oxide.

9. A method for producing a bonded structure comprising two base materials, at least one of which is a resin, comprising:

supplying oxide formed of lead-free glass containing V, Te, and Ag to the base materials, wherein the oxide contains $V_2O_5$, $TeO_2$, and $Ag_2O$, and any of Fe, Sb, W, Ba, and K, and an oxide mass % of $V_2O_5$ + an oxide mass % of $TeO_2$ + an oxide mass % of $Ag_2O$ is greater than or equal to 85 mass % and less than 100 mass % of a total mass of the oxide, wherein the oxide further comprises filler mixed with the oxide and providing the oxide with an adjusted thermal expansion coefficient, wherein the two base materials have different thermal expansion coefficients, and the adjusted thermal expansion coefficient of the oxide adjacent one of the base materials having a higher thermal expansion coefficient has a higher thermal expansion coefficient than the adjusted thermal expansion coefficient of the oxide adjacent the other of the base materials having a lower thermal expansion coefficient; and applying electromagnetic waves to the oxide to soften the oxide on the substrate to bond the two base materials.

* * * * *